United States Patent
Hurst et al.

(10) Patent No.: US 7,029,926 B2
(45) Date of Patent: Apr. 18, 2006

(54) DOUBLE DENSITY MRAM WITH PLANAR PROCESSING

(75) Inventors: Allan T. Hurst, Plymouth, MN (US); Jeffrey Sather, Medina, MN (US); Jason B. Gadbois, Minneapolis, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/991,876

(22) Filed: Nov. 18, 2004

(65) Prior Publication Data

US 2005/0068806 A1  Mar. 31, 2005

Related U.S. Application Data

(62) Division of application No. 10/651,619, filed on Aug. 29, 2003.

(51) Int. Cl.
*H01L 21/00* (2006.01)
(52) U.S. Cl. ............................ 438/3; 438/90; 365/48
(58) Field of Classification Search ............ 438/3, 438/17, 28, 61, 90; 365/48, 55, 66, 130, 365/158
See application file for complete search history.

(56) References Cited

U.S. PATENT DOCUMENTS

| | | | |
|---|---|---|---|
| 6,750,069 B1 * | 6/2004 | Durcan et al. | 438/3 |
| 6,927,073 B1 * | 8/2005 | Huggins | 438/3 |
| 2004/0004889 A1 | 1/2004 | Asao et al. | |
| 2004/0032010 A1 | 2/2004 | Kools et al. | |

* cited by examiner

*Primary Examiner*—Phuc T. Dang
(74) *Attorney, Agent, or Firm*—Knobbe, Martens, Olson & Bear, LLP.

(57) ABSTRACT

The semiconductor industry seeks to replace traditional volatile memory devices with improved non-volatile memory devices. The increased demand for a significantly advanced, efficient, and non-volatile data retention technique has driven the development of integrated magnetic memory structures. In one aspect, the present teachings relate to magnetic memory structure fabrication techniques in a high density configuration that includes an efficient means for programming high density magnetic memory structures.

14 Claims, 7 Drawing Sheets

DOUBLE DENSITY MRAM WITH PLANAR PROCESSING

RELATED APPLICATIONS

This application is a divisional of U.S. application Ser. No. 10/651,619, filed Aug. 29, 2003, which is hereby incorporated in its entirety herein.

BACKGROUND OF THE INVENTION

1. Field of the Invention

The present invention relates to semiconductor processing technology and, in particular, concerns a device and a fabrication process, whereby a magnetic memory structure may be formed.

2. Description of the Related Art

Magnetic memory is a developing technology that offers the advantages of non-volatile memory with high-density fabrication. Magnetic memory structures, such as magneto-resistive random access memory (MRAM), manipulate the magnetic properties of layered magneto-resistive materials to produce a selective resistance differential across the magnetic memory structure. In one aspect, magnetic memory structures utilize selective resistance by controlling the alignments of spin states within multiple layers of material to increase or decrease the resistance of a material. Selectively altering the spin states of magneto-resistive materials results in selectively altering the resistance of the magnetic memory structure, which may be sensed thereby permitting the use of layered magneto-resistive materials in logic state devices.

Conventional magnetic memory devices may comprise a stacked structure that may include a hard (high coercivity) layer, a soft (low coercivity) layer, and a non-magnetic layer interposed therebetween. The soft or sense layer may be programmed through the application of proximate magnetic field and the net magnetization vectors between the programmable layer and the hard layer may be changed between two discrete quantities, which may then be sensed to detect the programmed logic state of the magnetic memory device.

Additionally, magnetic memory devices, including MRAM, may also be referred to as a magnetic memory bit. Magnetic memory bits may utilize various technologies associated with at least one of, but is not limited to an anisotropic magnetoresistance (AMR) bit, a giant magnetoresistance (GMR) bit, a pseudo-spin valve (PSV) bit, and a spin-dependent tunneling (SDT) bit. A plurality of magnetic memory bits and the conductors that influence and/or access the magnetic memory bits may be arranged in a grid array, which may be formed on a semiconductor substrate layer, such as silicon. In a grid array, magnetic memory bits may be positioned adjacent one another and arranged on the substrate so as to be co-planar.

Due to the co-planar arrangement of conventional magnetic memory bits in a magnetic memory grid array, the areal density of the magnetic memory bits within the substrate plane is bounded by at least the amount of planar space available on the upper surface of the substrate. Other factors that may contribute to limiting density of conventional magnetic memory bits include physical size of the magnetic memory bits and the level at which fringe magnetic fields affect neighboring magnetic memory bits. Therefore, there exists a need to increase the fabrication density of magnetic memory bits, devices and/or structures without adversely affecting the performance, reliability, and functionality of the magnetic memory bits, devices, and/or structures.

SUMMARY OF THE INVENTION

The aforementioned needs may be satisfied by a memory device comprising, in one embodiment, a substrate having a first surface, a first memory layer having a first programmable component formed on the first surface of the substrate, wherein the first memory layer can be configured to store a first logic state therein by selective magnetization of the first programmable component, and a second memory layer having a second programmable component formed above the substrate in a manner so as to overlie the first memory layer, wherein the second memory layer can be configured to store a second logic state therein by selective magnetization of the second programmable component, and wherein the second memory layer increases the storage density of the memory device.

In one aspect, the memory device may further comprise a first plurality of electrodes that are formed in the first memory layer and electrically interconnected to the first programmable component and a second plurality of electrodes that are formed in the second memory layer and electrically interconnected to the second programmable component. Also, the first plurality of electrodes may comprise a conductive material that generates a first magnetic field when electrical current passes through the first plurality of electrodes. The second plurality of electrodes comprise a conductive material that generates a second magnetic field when electrical current passes through the second plurality of electrodes.

In addition, the memory device may further comprise a word line that is formed between and proximate to the first and second memory layer. The word line may comprise a conductive material that generates a third magnetic field when electrical current passes through the word line. The word line comprises at least one magnetic keeper that is configured to concentrate the third magnetic field generated by the word line towards at least one of the first programmable component and the second programmable component.

Moreover, the first memory layer may comprise a plurality of first programmable components that are configured in a grid array having columns and rows. The second memory layer may comprise a plurality of second programmable components that are configured in a grid array having columns and rows. The memory device may also comprise a plurality of word lines that are formed between the first and second memory layers in a manner such that each of the word lines defines a column comprising at least one of the plurality of first programmable components and at least one of the plurality of second programmable components. The first programmable component and the second programmable component may be selected from the group consisting of a pseudo spin valve (PSV) device, magnetic tunneling junction (MTJ) device, an inline giant magneto-resistive (GMR) device, and a magneto-resistive random access memory (MRAM) device.

The aforementioned needs may also be satisfied by a memory device comprising, in one embodiment, a substrate having a first surface, a first memory layer having a first plurality of memory components formed on the first surface of the substrate, wherein the first plurality of memory components are positioned in a first grid array having rows and columns, and wherein each of the first plurality of memory components can be configured to store a logic state therein by selective magnetization, and a second memory layer having a second plurality of memory components formed on the first memory layer in an overlying manner so as to increase the storage component density of the memory device, wherein the second plurality of memory components are positioned in a second grid array having rows and columns, and wherein each of the second plurality of memory components can be configured to store a logic state therein by selective magnetization.

In one aspect, the memory device may further comprise a first plurality of electrodes that are formed in the first memory layer so as to be substantially parallel to the rows in the first grid array and electrically interconnected to the first plurality of programmable components and a second plurality of electrodes that are formed in the second memory layer so as to be substantially parallel to the rows in the second grid array and electrically interconnected to the second plurality of programmable components. The memory device may still further comprise a plurality of proximate word lines formed between the first and second memory layers so as to be substantially parallel to the columns of the first and second grid arrays and substantially perpendicular to the first and second plurality of electrodes.

In another aspect, selective magnetization of at least one of the first plurality of memory components may occur when electrical current simultaneously passes through at least one of the first plurality of electrodes and through the corresponding proximate word line. In addition, selective magnetization of at least one of the second plurality of memory components may occur when electrical current simultaneously passes through at least one of the second plurality of electrodes and through the corresponding proximate word line. Also, each of the proximate word lines may generate a proximate magnetic field towards the first and second memory layer. Furthermore, each proximate word line may comprise at least one magnetic keeper that is configured to concentrate the generated magnetic field towards at least one of first memory layer and the second memory layer.

The aforementioned needs may be further satisfied by a method of forming a magnetic memory device on a substrate. In one embodiment, the method may comprise forming a first and second electrode on the substrate, forming a first magnetic memory component on the first and second electrode in a manner so as to be electrically coupled therewith, forming a first insulation layer on the substrate in a manner so as to overlie the first magnetic memory component and the first and second electrode, and forming a word line on the first insulation layer. The method may further comprise forming a second insulating layer on the first insulating layer in a manner so as to overlie the word line, forming a third and fourth electrode on the second insulating layer, forming a second magnetic memory component on the third and fourth electrode in a manner so as to be electrically coupled therewith, wherein forming the second magnetic component increases the storage and fabrication density of the memory device, and forming a third insulating layer on the second insulating layer in a manner so as to overlie the second magnetic memory component and the third and fourth electrodes.

The aforementioned needs may also be satisfied by another method of increasing the density of a magnetic memory device having a substrate. In another embodiment, the method may comprise forming a first memory layer on the substrate, wherein the first memory component comprises at least one magnetic storage component and a plurality of electrodes electrically coupled therewith, forming a word line on the first memory layer, and forming a second memory layer above the word line, wherein the second memory layer comprises at least one magnetic storage component and a plurality of electrodes electrically coupled therewith, and wherein forming the second memory layer increases the fabrication density of the magnetic memory device.

In one aspect, forming the first memory layer may include planarizing the first memory layer. In another aspect, the method may further comprise forming a first insulation layer between the first memory layer and the word line, wherein forming the word line includes planarizing the word line. In addition, the method may further comprise forming a second insulation layer between the word line and the second memory layer, wherein forming the second memory layer includes planarizing the second memory layer. Moreover, the method may still further comprise forming one or more additional memory layers on the second memory layer, wherein the one or more additional memory layers comprise at least one magnetic storage component and a plurality of electrodes electrically coupled therewith. Furthermore, the method may yet further comprise forming one or more insulation layers between the additional memory layers. These and other objects and advantages of the present teachings will become more fully apparent from the following description taken in conjunction with the accompanying drawings.

DETAILED DESCRIPTION OF THE PREFERRED EMBODIMENT

The present teachings relate to structures and methods for forming magneto-resistive memory and associated electrode structures. FIGS. 1A–1L illustrate one embodiment of a method of forming a magneto-resistive memory element of a magnetic memory device having at least a double density structure. Reference will now be made to the drawings wherein like numerals refer to like parts throughout.

Figure 1A:
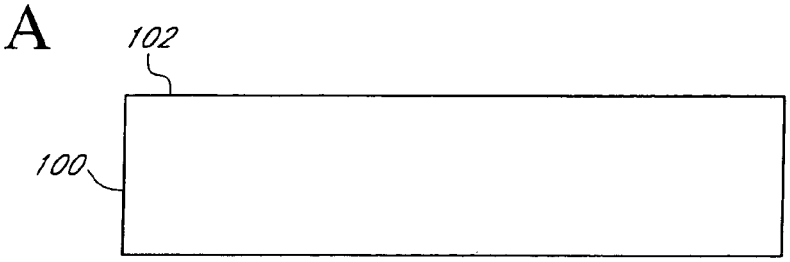
FIGS. 1A–1L illustrate one embodiment of a method of forming a magneto-resistive memory element of a magnetic memory device having at least a double density structure.

FIG. 1A illustrates one embodiment of a substrate 100 having a substantially planar substrate surface 102 upon which a magnetic memory element, such as a magnetic memory device structure, will be fabricated in accordance with a method of the present teachings. The substrate 100 may comprise, for example, layers and structures (not shown) which are generally known in the art for the formation of electrical circuitry.

As used herein, the term "substrate" or "semiconductor substrate" shall encompass structures comprising semiconductor material, including, but not limited to, bulk semiconductor materials such as a semiconductor wafer (either alone or in assemblies comprising other materials thereon), and semiconductive material layers (either alone or in assemblies comprising other materials). The term "substrate" or "semiconductor substrate" shall also encompass, for example, semiconductor-on-insulator (SOI) structures. In addition, the term "substrate" or "semiconductor substrate" shall further encompass any supporting structures, including, but not limited to, the semiconductive substrates described herein below. Furthermore, when reference is made to the term substrate within the following description, previous process steps may have been utilized to form regions, structures, or junctions in or on its base semiconductor structure or foundation.

It should be appreciated that the scope of the present teachings may encompass substrates of non-flat surfaces or structures over which an insulating material may be deposited and then planarized using, for example, a generally known chemical mechanical planarization (CMP) process to form a substantially planar surface upon which fabrication of a magnetic memory element, as described herein, may be accomplished in accordance with a method of the present teachings. In addition, an epitaxial layer, comprising, in one embodiment, Silicon, may be formed on the substrate 100 adjacent the substrate surface 102 using, for example, a chemical vapor deposition (CVD) process. As is generally known in the art, an epitaxial Silicon layer typically comprises fewer impurities than a Silicon wafer. Therefore, the epitaxial Silicon layer comprises a higher grade of Silicon than the Silicon wafer due to the deposition of Silicon using the CVD process.

Figure 1B:
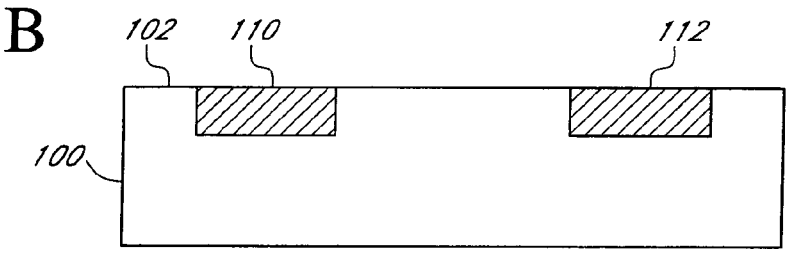

FIG. 1B illustrates one embodiment of a first plurality of electrodes formed on the substrate 100, wherein a first and second electrode 110, 112 may be formed below the substrate surface 102 using, for example, a generally known dual damascene process. The first and second electrodes 110, 112 may comprise a conductive material, such as copper (Cu), having a thickness of approximately 2000 Å. In one aspect, copper is a desirable conductor to use for metalization in integrated circuitry due to its low resistivity and high electromigration resistance.

As is known in the art, the dual damascene process involves forming recessed cavities in a substrate, such as the substrate 100. After depositing conductive material, such as copper, in the recessed cavities using known techniques, a CMP process is used to planarize the upper surface of the substrate so that the upper portion of the conductive material is substantially co-planar with the upper surface of the substrate 100. It should be appreciated that the first electrode 110 may be used as a first electrical contact reference point for a first magnetic memory element. In addition, the second electrode 112 may be used as a second electrical contact reference point for the first magnetic memory element, which will be described in greater detail herein below.

Figure 1C:
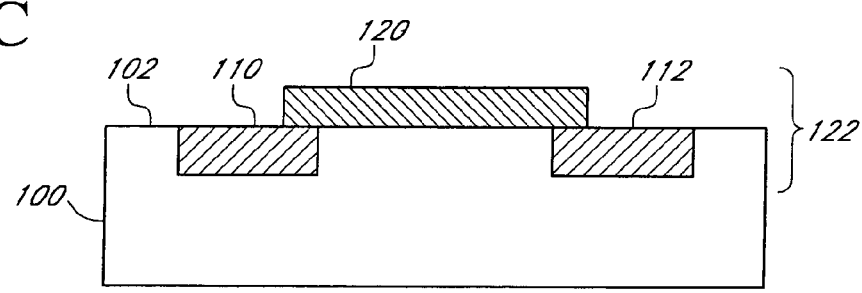

FIG. 1C illustrates one embodiment of a first magnetic memory structure 120 formed on the substrate 100 above the substrate surface 102 in a manner so to form a first magnetic memory layer 122. The first magnetic memory structure 120 may also be referred to as a magnetic memory bit, wherein a logic state may be stored in the magnetic memory bit or structure 120 in a manner that will be described in greater detail herein below. The first magnetic memory structure 120 may comprise, for example, an magneto-resistive random access memory (MRAM) cell, an inline giant magneto-resistive (GMR) cell, a pseudo-spin valve (PSV) cell, a magnetic tunneling junction (MTJ) cell, or various other generally known embodiments of magnetic memory cells. As illustrated in FIG. 1C, the first magnetic memory layer 122 includes the first magnetic memory structure 120 and the corresponding first and second electrodes 110, 112.

In one aspect, a conventional magnetic memory structure may comprise layers of magnetic material including at least a hard magnetic layer, an inner layer, a soft magnetic layer, and one or more contact electrodes. It should be appreciated that various practical applications of the magnetic memory structure 120 may further comprise various other layers for specialized functions without departing from the scope of the present teachings. It should also be appreciated that the overall thickness of the magnetic memory structure 120 may vary depending on the particular application and device configuration used. Therefore, changes and/or alterations to the disclosed embodiment may be made by one skilled in the art without departing from the scope of the present teachings.

The hard magnetic layer may comprise, in one embodiment, a "hard" magnetic material, such as a layer of NiFe, NiFeCo, or CoFe, with a first thickness between about 10 Å and 50 Å. The "hard" magnetic material is so called due to its magnetization orientation is maintained in the face of relatively low magnetic fields used during operation. Magnetic memory stack layers, including the hard magnetic layer, may be formed in a manner generally known in the art by deposition techniques, such as sputter-deposition, physical vapor deposition, or ion-beam deposition. After deposition of the "hard" magnetic material, the hard magnetic layer may be planararized using a CMP process so as to provide a substantially flat, smooth upper surface for the deposition of additional overlying layers. In one aspect, the hard layer may be magnetized in a first fixed direction and acts as a first reference point for the net directional magnetization vectors of the magnetic memory structure 120. Accordingly, the hard magnetic layer may also be referred to herein as the magnetically pinned layer.

The soft magnetic layer may comprise, in one embodiment, a "soft" magnetic material, such as a layer of NiFe, NiFeCo, or CoFe, with a second thickness of approximately 30 Å and may be positioned above or below the hard magnetic layer. The "soft" magnetic material is so-called due to its readily re-oriented magnetization by relatively weak magnetic fields, and so serves as the "sense" layer in the magnetic memory structure 120. Magnetic memory stack layers, including the soft layer, are formed in a manner generally known in the art by deposition techniques, such as sputter-deposition, physical vapor deposition, and ion-beam deposition. After deposition of the "soft" magnetic material, the soft magnetic layer may be planararized using a CMP process so as to provide a substantially flat, smooth upper surface for the deposition of additional overlying layers. In one aspect, the soft or sense layer may be magnetized in the first fixed direction or a second direction opposite of the first direction, depending on an applied magnetic field, and provides a second reference point for the net directional magnetization vectors of the magnetic memory structure 120. Accordingly, the soft magnetic layer may also be referred to herein as the magnetically programmable layer.

In one embodiment, PSV cells use an inner layer that may comprise a thin layer of copper (Cu) that is approximately 10 to 30 Å thick and positioned interposedly between the hard and soft magnetic layers. Various fabrication techniques utilized for forming the inner layer may include depositing a copper material in a manner generally known in the art using deposition techniques, such as chemical vapor deposition (CVD) and plasma enhanced CVD (PECVD), wherein all may be derived in a manner generally known in the art. After deposition of the dielectric material, the inner layer may be planararized using a CMP process so as to provide a substantially flat, smooth upper surface for the deposition of additional overlying layers. In one aspect, the inner layer serves as a conduit for current to flow through the magnetic memory structure 120. In one aspect, the above-mentioned PSV stacked layers of the magnetic memory structure 120 may be oriented and/or positioned to comprise a current-in-plane (CIP) configuration, wherein the read and/or write current passes in a substantially parallel manner through the structure 120.

In an alternative embodiment, MTJ cells use an inner layer that may comprise a thin dielectric layer of Aluminum Oxide ($Al_2O_3$) that is approximately 10 to 15 Å thick and positioned interposedly between the hard and soft magnetic layers. Various fabrication techniques utilized for forming the inner layer may include depositing an aluminum layer in a manner generally known in the art, and, then, oxidation of the aluminum layer may achieved by one of several different methods, such as plasma oxidation, oxidation by air, and ion-beam oxidation, wherein all may be derived in a manner generally known in the art. After deposition of the dielectric material, the inner layer may be planararized using a CMP process so as to provide a substantially flat, smooth upper surface for the deposition of additional overlying layers. In one aspect, the thin dielectric layer serves as a tunneling conduit for excited electrons to flow through without causing dielectric breakdown of the magnetic memory structure 120 at low voltages. Accordingly, the inner layer may also be referred to herein as the tunneling dielectric layer. In one aspect, the above-mentioned TMJ stacked layers of the magnetic memory structure 120 may be oriented and/or positioned to comprise a current-perpendicular-to-plane (CPP) configuration, wherein the read and/or write current passes in a substantially perpendicular manner through the structure 120.

In a manner as described above, magnetic memory cells, devices, and/or structures may comprise vertically ordered layers of material that exhibit a variable resistance depending on the magnetization state of the material. Some magnetic memory cells, devices, and/or structures incorporate at least two layers of magnetic material separated by at least one layer of dielectric material. As previously described, the magnetic layers may comprise a hard (magnetically pinned) layer and a soft (magnetically programmable) layer. The selective programmability of the soft layer enables the magnetic memory cells, devices, and/or structures to function as a logic state device, which may be used to store binary data as directions of net magnetization vectors in at least one of the magnetic layers. In one aspect, current flow through two proximate orthogonal conductors may be used to polarize the magnetic components of the soft layer in either a parallel or antiparallel direction.

Therefore, the parallel and antiparallel magnetization states of the magnetic layers may correspond to at least two different resistance states, wherein a high and low resistance state may represent a logical "1" or "0," respectively. In other words, when the magnetic materials are layered in a particular fashion, they may exhibit a variable vertical electrical resistance depending on the magnetization state of the individual layers. For example, if the magnetic layers are individually magnetized in the same (parallel) direction, the magnetic memory cells, devices, and/or structures exhibit a low electrical resistance. Whereas, if the magnetic layers are individually magnetized in opposite (antiparallel) direction, the magnetic cells, devices, and/or structures exhibit a high electrical resistance. In one aspect, when the magnetic components of the layers are aligned in parallel, the current may travel through the magnetic material with minimal scattering, which may result in an overall lower resistance. However, in the case where magnetic layers are oppositely magnetized, the current may flow with increased scattering due to the antiparallel orientation of the magnetic components.

As described above, the first magnetic memory structure 120 represents one of many useable configurations of a magnetic memory cell structure in a stacked formation. In one embodiment, there are essentially two conducting layers that are separated by a thin dielectric layer. In other arrangements, the skilled artisan will appreciate that the order of the layers may be altered, such that the magnetically programmable layer is positioned above or below the magnetically fixed layer, while maintaining the interposed position of the tunneling dielectric layer. It should be appreciated that practical applications of the proposed magnetic memory cell structure may include other layers for specialized functions without departing from the scope of the present teachings.

Figure 1D:
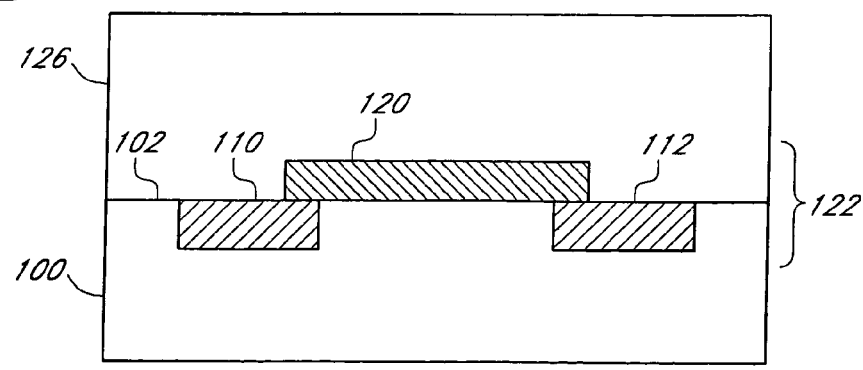

FIG. 1D illustrates one embodiment of a first insulating layer 126 formed on the first magnetic memory layer 122 in a manner so as to overlie the magnetic memory structure 120 and the corresponding electrodes 110, 112. The first insulating layer 126 may comprise an insulating material, such as silicon-dioxide ($SiO_2$), having a thickness of approximately 4000 Å. After deposition of the insulating material, the first insulating layer 126 may be planararized using a CMP process so as to provide a substantially flat, smooth upper surface for the deposition of additional overlying layers. As illustrated in FIG. 1D, the first insulating layer 126 serves as an insulating and spacing barrier between a plurality of stacked magnetic memory layers in a manner as will be described in greater detail herein below.

FIGS. 1E–1H illustrate the formation of one embodiment of a word line 130 having a first and second keeper 132, 134 that may be formed adjacent to the upper surface of the first insulating layer 126. It should be appreciated that the keepers 132, 134 may also be referred to as magnetic keepers without departing from the scope of the present teachings.

Figure 1E:
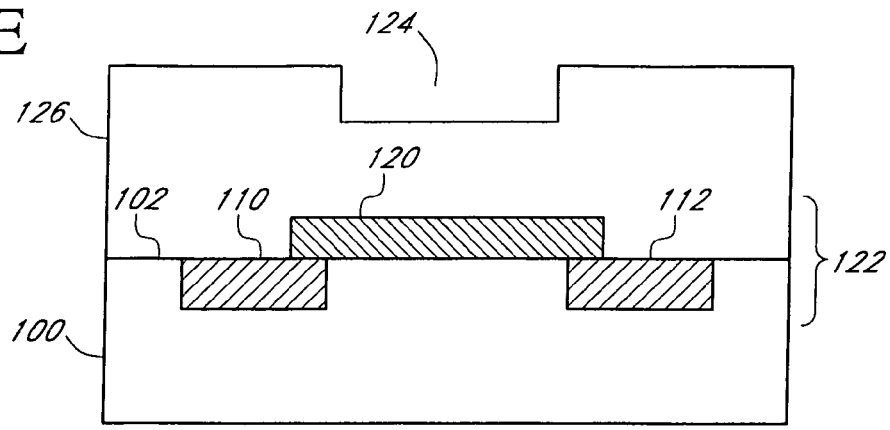

FIG. 1E illustrates one embodiment of a first recessed well 124 formed in the first insulating layer 126. The first recessed well 124, having a depth of approximately 2000 Å and a width of approximately 4300 Å, may be formed adjacent to the upper surface of the first insulating layer 126 and above the magnetic memory structure 120 using a generally known pattern and etch technique. In a preferred embodiment, the etching technique may comprise a generally known anisotropic etching technique so as to form substantially vertical walls in the first recessed well 124 in a manner as illustrated in FIG. 1E.

Figure 1F:
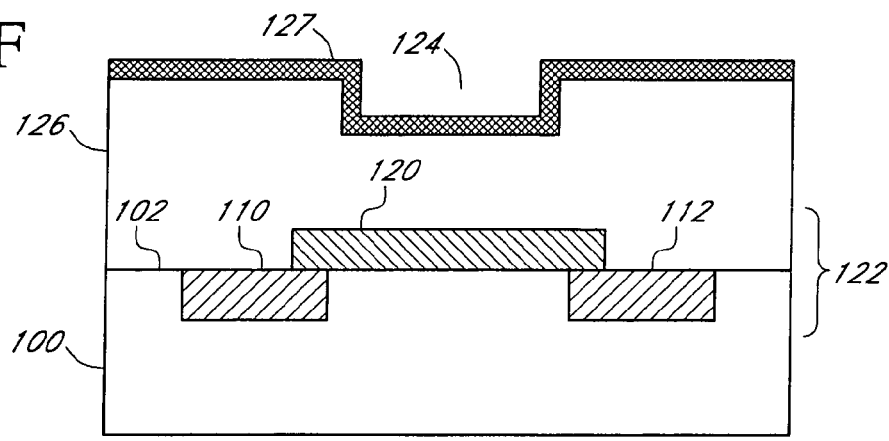

FIG. 1F illustrates one embodiment of a keeper layer 127 formed in the first recessed well 124 of FIG. 1E in a manner so as to fill the first recessed well 124 adjacent the upper surface of the first insulating layer 126. The keeper layer 127 may be deposited using generally known deposition techniques, such as such as sputter-deposition, physical vapor deposition, and ion-beam deposition and then planarized to the upper surface of the first insulating layer 126 using a generally known CMP process. In one aspect, the keeper layer 127 may be uniformly deposited so as to overlie the first insulating layer 126 including the first recessed well 124. In addition, the keeper layer 127 may comprise a magnetic material, such as $Ni_{80}Fe_{20}$, having a thickness of approximately 400 Å.

Figure 1G:
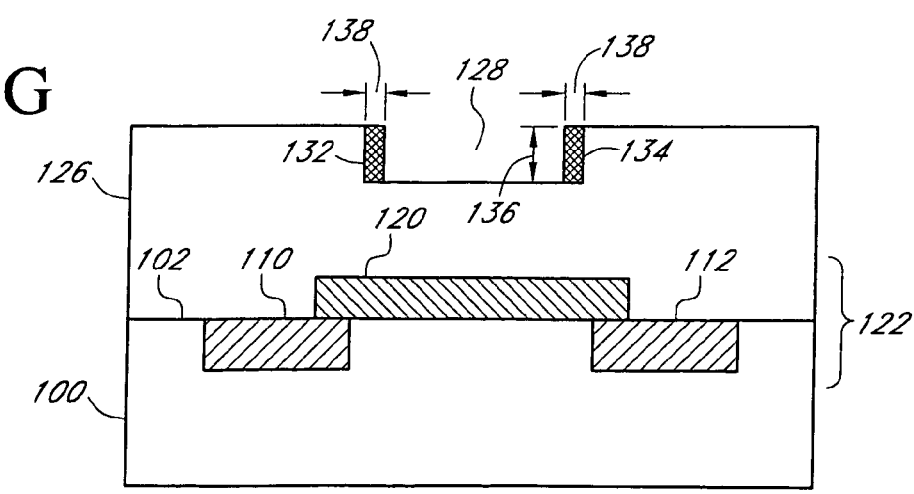

FIG. 1G illustrates the formation of first and second magnetic keepers 132, 134 at each distal end of the keeper layer 127 by forming a second recessed well 128 in the keeper layer 127. The second recessed well 128, having a depth of approximately 2000 Å and a width of approximately 3500 Å, may be formed in the same manner as described with reference to the formation of the first recessed well 124 in FIG. 1E. In one embodiment, the first and second magnetic keepers 132, 134 may comprise a thickness or height 136 of approximately 2000 Å and a width 138 of approximately 400 Å. The scope and functionality of the magnetic keepers 132, 134 will be described in greater detail herein below with reference to FIG. 1H.

Figure 1H:
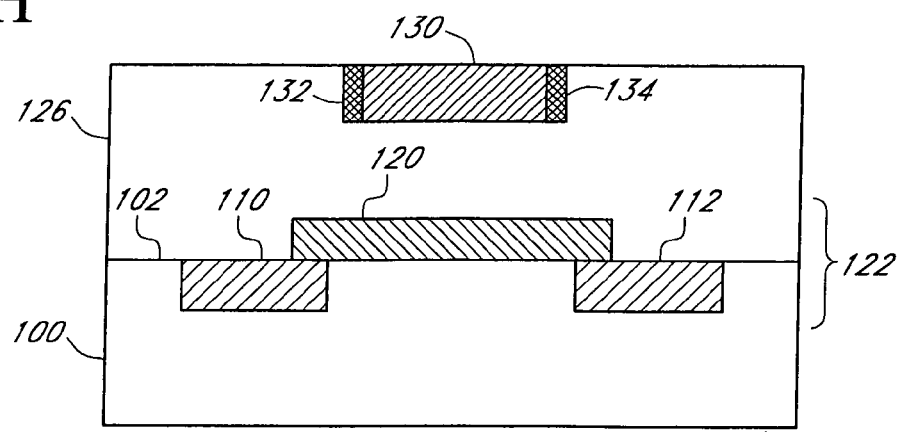

FIG. 1H illustrates one embodiment of a word line 130 formed in the second recessed well 128 and adjacent to the upper surface of the first insulating layer 126. As illustrated in FIG. 1H, the word line 130 is further formed in a manner so as to be interposed between the first and second magnetic keepers 132, 134. In one aspect, the word line 130 may be formed below the upper surface of the first insulating layer 126 using, for example at least in part, a generally known dual damascene process. The process of forming the word line 130 is similar to above-described process of forming the first and second electrodes 110, 112 in FIG. 1B. The word line 130 may comprise a conductive material, such as copper, having a thickness of approximately 2000 Å. In one aspect, the word line 130 comprises a proximate conductor that serves as a magnetic field generator for the purpose of programming the net magnetization vectors of the magnetic memory structure 120, wherein the word line 130 may be positioned substantially perpendicular to the electrodes 110, 112. As is known in the art, the net magnetization vectors of the magnetic memory structure 120 may be altered and/or changed by current flowing in a proximate conductor.

In one embodiment, the first and second keepers and/or magnetic keepers 132, 134 may be utilized as magnetic field or flux concentrators, which may be configured to influence the direction of the magnetic field from the word line 130 in an upward and/or downward direction relative to the word line 130. In one aspect, a "soft" magnetic material may be deposited on the sides of the word line 130 to serve as magnetic keeper layers, which may assist with concentrating the magnetic field generated by current flowing through the conductive word line 130 away from the sides of the word line 130 and towards the upper and lower regions of the word line 130. In a manner as previously described, the first and second magnetic keepers 132, 134 may be positioned adjacent the word line 130 as illustrated in FIG. 1H. For further description relating to the scope and functionality of magnetic keepers, the Applicant's co-pending patent application entitled "A Method for Building a Magnetic Keeper or Flux Concentrator Used for Writing Magnetic Bits" Ser. No. 10/226,623 is hereby incorporated by reference in its entirety.

Figure 1I:
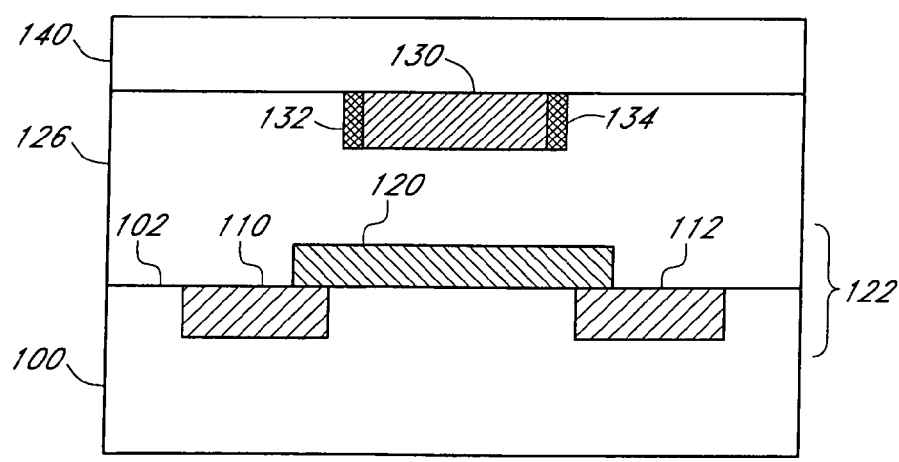

FIG. 1I illustrates one embodiment of a second insulating layer 140 formed on the upper surface of the first insulating layer 126 in a manner so as to overlie the first insulating layer 126 and the word line 130 including the magnetic keepers 132, 134. Similar to the first insulating layer 126, the second insulating layer 140 may comprise an insulating material, such as silicon-dioxide ($SiO_2$), having a thickness of approximately 4000 Å. After deposition of the insulating material, the second insulating layer 140 may be planarized using a CMP process so as to provide a substantially flat, smooth upper surface for the deposition of additional overlying layers. As illustrated in FIG. 1I, the second insulating layer 140 serves as an additional insulating and spacing barrier between stacked magnetic memory layers in a manner as will be described in greater detail herein below.

Figure 1J:
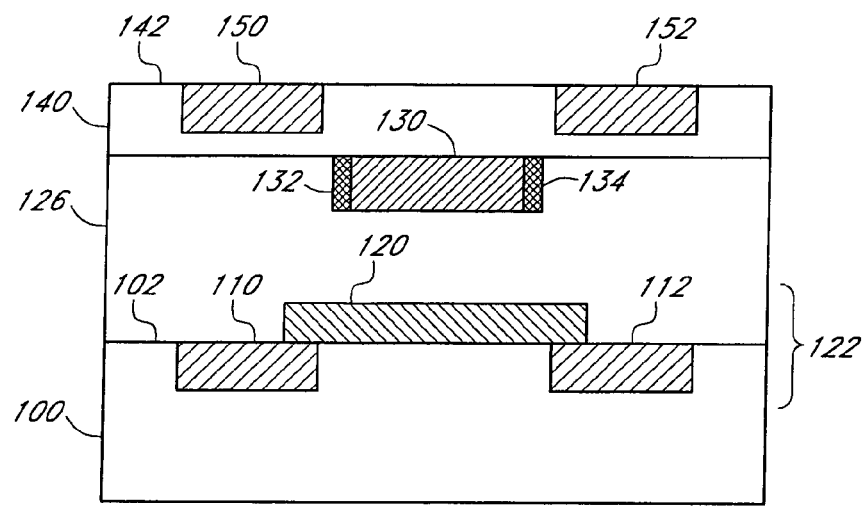

FIG. 1J illustrates one embodiment of a second plurality of electrodes formed on the second insulating layer 140, wherein a third and fourth electrode 150, 152 may be formed below the upper surface of the second insulating layer 140 using, for example, a generally known dual damascene process. Similar to the first and second electrodes 110, 112, the third and fourth electrodes 150, 152 may comprise a conductive material, such as copper, having a thickness of approximately 2000 Å. As previously described, copper is a desirable conductor to utilize and implement for metalization in integrated circuitry due to its low resistivity and high electromigration resistance.

As previously described with reference to FIG. 1B, the dual damascene process involves forming recessed cavities in a substrate material, such as the second insulating layer 140. After depositing conductive material, such as copper, in the recessed cavities using known techniques, a CMP process is used to planarize the upper surface of the substrate such that the upper portion of the conductive material is substantially co-planar with the upper surface of the second insulating layer 140. It should be appreciated that the third electrode 150 may be used as a first electrical contact reference point for a second magnetic memory element. In addition, the fourth electrode 152 may be used as a second electrical contact reference point for the second magnetic memory element, which will be described in greater detail herein below.

Figure 1K:
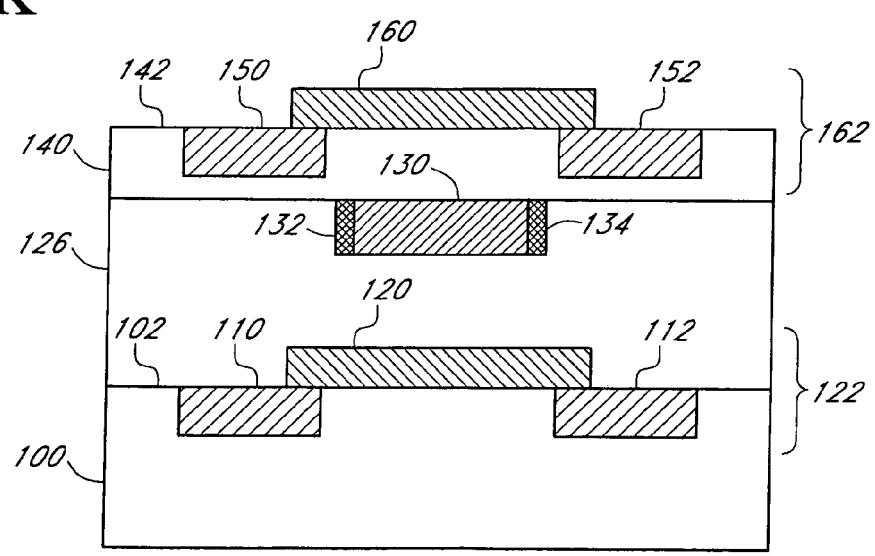

FIG. 1K illustrates one embodiment of a second magnetic memory structure 160 formed on the upper surface of the second insulating layer 140 in a manner so to form a second magnetic memory layer 162. Similar to the first magnetic memory structure 120, the second magnetic memory structure 160 may comprise, for example, an MRAM cell, magnetic tunneling junction (MTJ) cell, a pseudo-spin valve cell, or various other generally known embodiments of magnetic memory cells. As illustrated in FIG. 1K, the second magnetic memory layer 162 includes the second magnetic memory structure 120 and the corresponding third and fourth electrodes 150, 152.

In one aspect, the second magnetic memory structure 160 may comprise similar scope, composition, and functionality as with the first magnetic memory structure 120. Additionally, each layer of the second magnetic memory structure 160 may be planararized using a CMP process so as to provide a substantially flat, smooth upper surface for the deposition of other overlying layers. In one embodiment of the present teachings, the formation of the first and second magnetic memory layers 122, 162, including the first and second magnetic memory structures 120, 160 and the first, second, third, and fourth electrodes 110, 112, 150, 152, would involve the same processing steps. It should be appreciated that, depending on the particular application of the device, the first and second magnetic memory structures 120, 160 may comprise different cell configurations without departing from the scope of the present teachings.

As previously described above, the second magnetic memory structure 160 represents one of many useable configurations of a magnetic memory cell structure in a stacked formation. In one embodiment, there are essentially two conducting layers that are separated by a thin dielectric layer. In other arrangements, the skilled artisan should appreciate that the sequential order of layers may be altered and/or changed, such that the "soft" layer is positioned above or below the "hard" layer, while maintaining the interposed position of the inner layer. It should be appreciated that most practical applications of the above-mentioned magnetic memory cell structure may include various layers comprising specialized functions without departing from the scope or spirit of the present teachings.

Figure 1L:
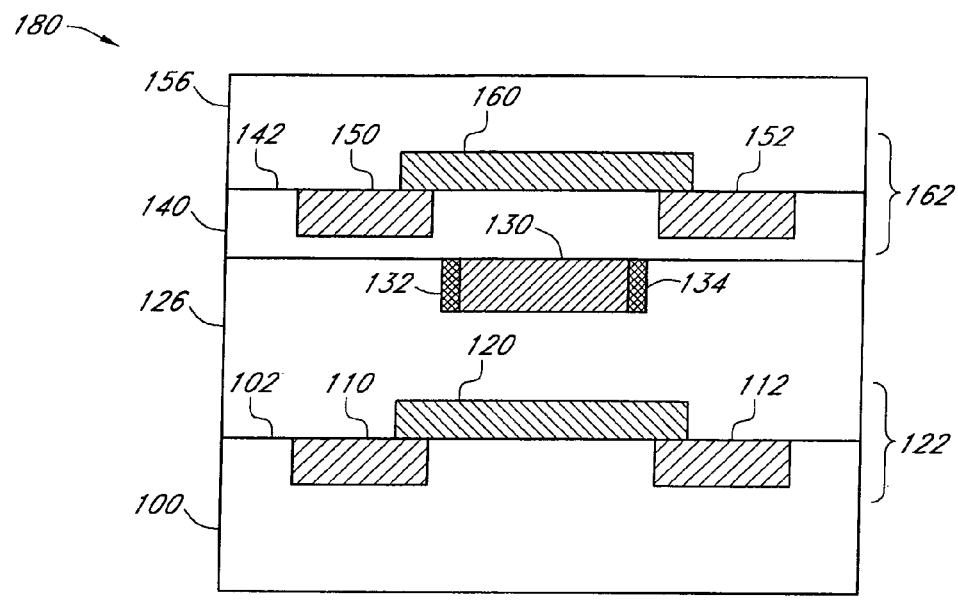

FIG. 1L illustrates one embodiment of a third insulating layer 156 formed on the upper surface 142 of the second insulating layer 140 in a manner so as to overlie the second insulating layer 140 and the second magnetic memory layer 162. The third insulating layer 156 may comprise an insulating material, such as silicon-dioxide ($SiO_2$), having a thickness of approximately $\geq 5000$ Å. After deposition of the insulating material, the third insulating layer 156 may be planararized using a CMP process so as to provide a substantially flat, smooth upper surface for the deposition of, for example, additional overlying layers. As illustrated in FIG. 1L, the third insulating layer 156 serves as an insulating barrier between second magnetic memory layer 162 in a manner so as to provide insulation from the environment and/or other integrated circuit components. Due to the physical arrangements of the above-mentioned layers, magnetic memory structures may follow the same high-density fabrication techniques as their semiconductor counterpart.

FIG. 1L further illustrates one embodiment of a magnetic memory device 180 having at least two magnetic memory layers 122, 162 and at least one word line 130 that may be formed by the above-mentioned fabrication process as referenced by FIGS. 1A–1L. It should be appreciated that one or more word lines 130 may be used in the first magnetic memory device 180 to program the magnetic memory structures 120, 160 by one skilled in the art without departing from the scope of the present teachings.

As further illustrated in FIG. 1L, the at least two magnetic memory layers 122, 162 and at least one word line 130 may be formed and positioned in a column configuration, wherein the at least one word line 130 may be used to influence and/or program the magnetically programmable logic state of one or more of the at least two magnetic memory layers 122, 162. It should be appreciated that the at least two magnetic memory layers 122, 162 and the at least one word line 130 may be formed and positioned in a row configuration without departing from the scope of the present teachings.

Figure 1M:
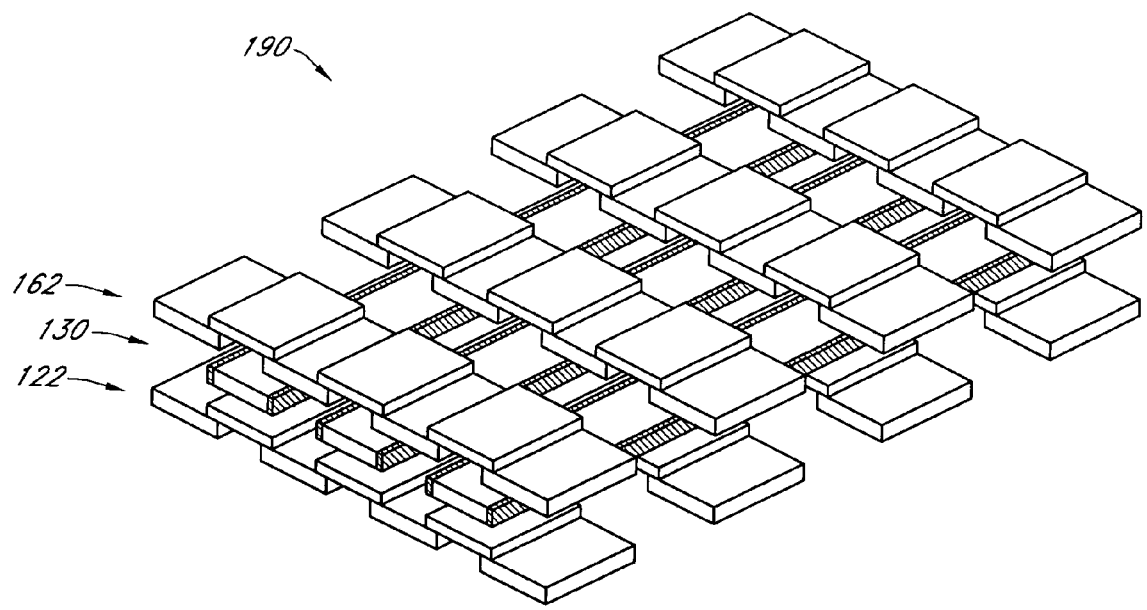
FIG. 1M illustrates one embodiment of a plurality of magnetic memory layers that may be stacked in a layered configuration so as to form a multiple layer grid array.

In one aspect, a plurality of magnetic memory structures or bits may be positioned adjacent to each other and interconnected in a manner so as to form a grid array within a single magnetic memory layer. As illustrated in FIG. 1M, a plurality of magnetic memory layers may be stacked so as to form one embodiment of a multiple layer grid array 190, wherein the first magnetic memory layer 122 may comprise a first plurality of magnetic memory structures or bits configured in a first grid array, and the second magnetic memory layer 162 may comprise a second plurality of magnetic memory structures or bits in a second grid array. As further illustrated in FIG. 1M, a plurality of word lines 130 may be interposedly positioned between the first and second memory layers 122, 162 so as to form a column of magnetic memory structures or bits.

Advantageously, the illustrated double density configuration 190 of the magnetic memory device 180 comprises increased storage capacity and preferably uses one word line 130 to write to a column of magnetic memory bits 120, 160. It should be appreciated that additional magnetic memory layers may be formed above and below the first and second magnetic memory layers 122, 162 in a manner as previously described with reference to FIGS. 1A–1L, wherein the magnetic memory device 180, which may include devices such as MRAM, may comprise one or more stacked magnetic memory cells, structures, and/or layers to improve component density.

It should also be appreciated that the current flowing in the word line 130 and the distance between structures 120, 130, 160 may be selected so that the generated magnetic field by the first word line 130 affects or influences the magnetization state of the first and second magnetic memory structure 120, 160 in a manner that is substantially similar. Preferably, the generated magnetic field by the word line 130 affects and influences the first magnetic memory structure 120 when a current is present in the first and second electrodes 110, 112. Additionally, the generated magnetic field by the word line 130 affects and influences the second magnetic memory structure 160 when a current is present in the third and fourth electrodes 150, 152. In one aspect, the magnetic field generated in the first and second electrodes 110, 112 does not interfere with the magnetic field generated by the current in the third and fourth electrodes 150, 152.

Figure 2A:
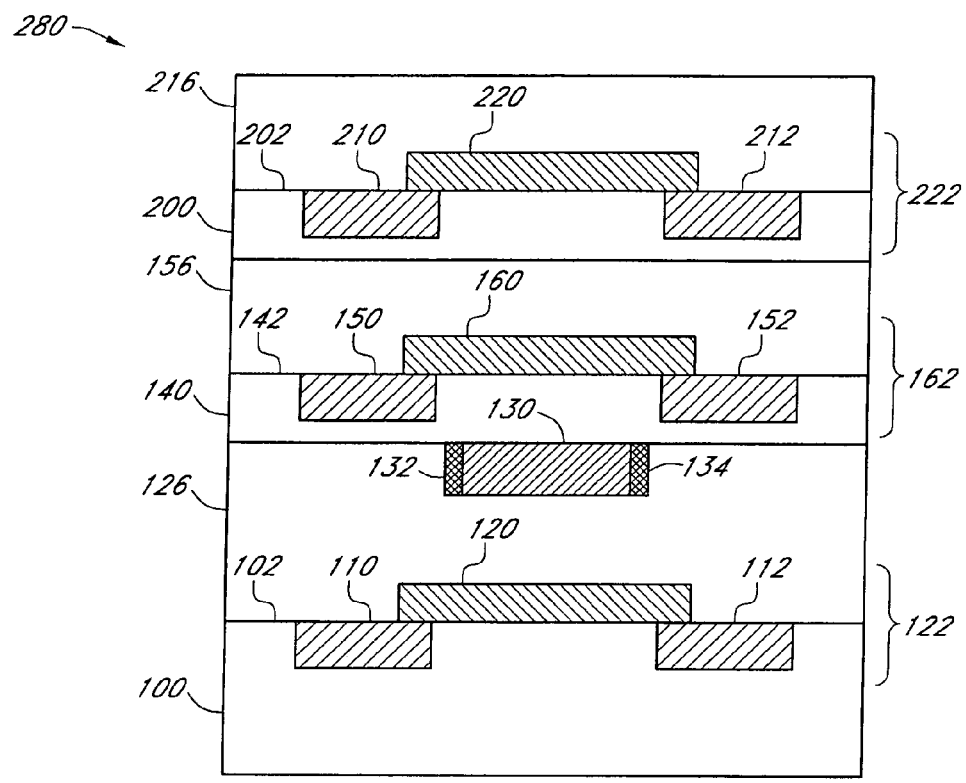
FIG. 2A illustrates another embodiment of a magnetic memory device that may comprise a plurality of magnetic memory layers having at least one word line.

FIG. 2A illustrates another embodiment of magnetic memory device 280 further comprising a plurality of magnetic memory layers 122, 162, 222 having at least one word line 130. As illustrated in FIG. 2A, the magnetic memory device 280 may comprise the same scope and functionality of the magnetic memory device 180 as illustrated in FIGS. 1A–1L with the addition of a third magnetic memory layer 222. It should be appreciated that additional magnetic memory layers may be formed above and/or below the first and second magnetic memory layers 122, 162 in a manner as previously described by one skilled in the art without departing from the scope of the present teachings. In addition, it should also be appreciated that the order in which the magnetic memory layers 122, 162, 222, including the at least one word line 130, are positionally oriented and/or configured may be changed and/or altered by one skilled in the art without departing from the scope of the present teachings.

In one embodiment, a fourth insulating layer 200 may be formed on the upper surface of the third insulating layer 156 in a manner so as to overlie the third insulating layer 156 and provide a surface 202 for forming the additional (third) magnetic memory layer 222. In one aspect, the third magnetic memory layer 222 may comprise a third plurality of electrodes formed on the third insulating layer 156, wherein a fifth and sixth electrode 210, 212 may be formed below the upper surface of the third insulating layer 156 using, for example, a generally known dual damascene process. In addition, the third magnetic memory layer 222 may further comprise a third magnetic memory structure 220, which may be formed in a similar manner as with the first and second magnetic memory structures 120, 160. After forming the third magnetic memory layer 222, a fifth insulating layer 216 may be formed on the upper surface of the fourth insulating layer 200 in a manner so as to overlie the fourth insulating layer 200 and the third magnetic memory layer 222 in a manner as previously described with reference to the third insulating layer 156 in FIG. 1L.

Advantageously, as illustrated in FIG. 2A, a plurality of magnetic memory layers 122, 162, 222 may be configured in a column orientation to comprise a plurality of magnetic memory structures or bits 120, 160, 220 that may be programmed using a single word line 130. The current through the word line 130 may be adjusted to influence the one or more magnetic memory bits 120, 160, 220. By layering magnetic memory bits 120, 160, 220 above the substrate 100 in a column orientation, an increase in areal device density of magnetic memory may be achieved without increasing the substrate surface requirement for increased device density. Therefore, in one aspect, the areal density of the magnetic memory bits within the substrate plane is no longer bounded by at least the amount of planar space available on the upper surface of the substrate. Additionally, by using a single word line 130 to influence the programmable magnetization of a plurality of magnetic memory bits 121, 160, 210, an increase in device efficiency may also be achieved. As a result, an increase in magnetic memory device performance, reliability, and functionality is achieved.

Figure 2B:
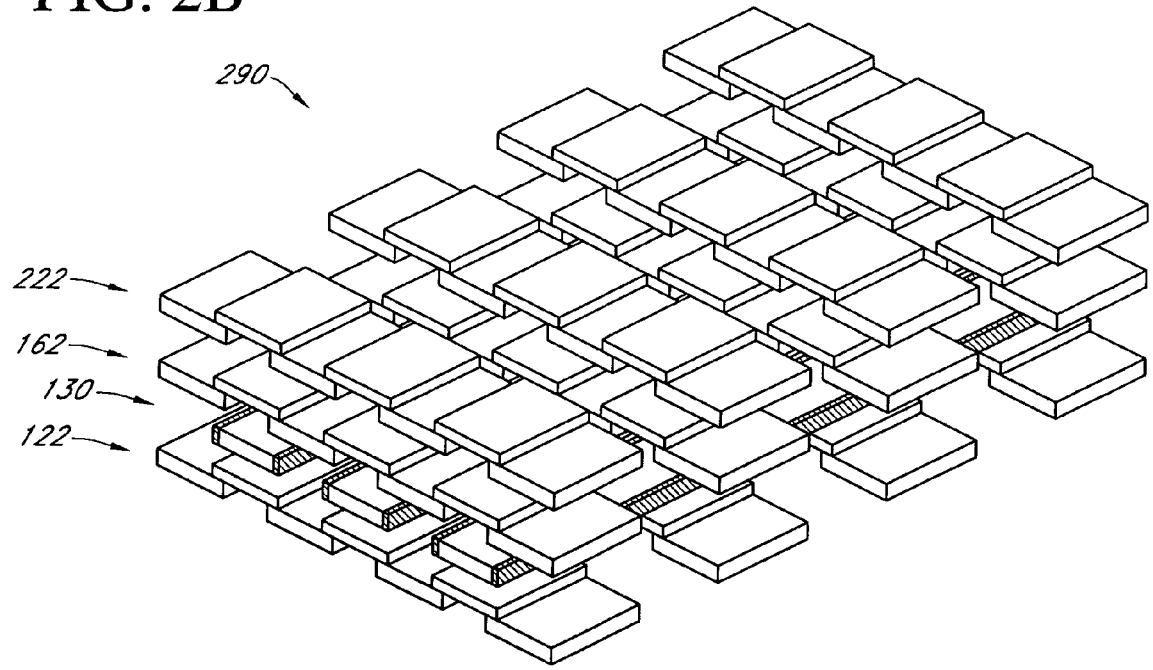
FIG. 2B illustrates another embodiment of a plurality of magnetic memory layers that may be stacked in a layered configuration so as to form another multiple layer grid array.

Additionally, as illustrated in FIG. 2B, a plurality of magnetic memory structures or bits may be positioned adjacent to each other and interconnected in a manner so as to form another embodiment of a multiple layer grid array 290 using the plurality of magnetic memory layers 122, 162, 222. In one aspect, the first magnetic memory layer 122 may comprise the first plurality of magnetic memory structures or bits configured in the first grid array, the second magnetic memory layer 162 may comprise the second plurality of magnetic memory structures or bits in the second grid array, and a third magnetic memory layer 222 may comprise a third plurality of magnetic memory structures or bits in a third grid array. As further illustrated in FIG. 2B, a plurality of word lines 130 may be interposedly positioned between the first, second, and third memory layers 122, 162, 222 so as to form a plurality of columns each having a plurality of magnetic memory structures or bits.

Advantageously, the illustrated triple density configuration 290 of the magnetic memory device 280 of FIG. 2A may comprise increased storage capacity and preferably uses a single column positioned word line 130 to write to a single column of magnetic memory bits 120, 160, 222. It should be appreciated that one or more additional magnetic memory layers may be formed above and/or below the first, second, and third magnetic memory layers 122, 162, 222 in a manner as previously described, wherein the first magnetic memory device 180, which may include devices such as MRAM, may comprise one or more stacked magnetic memory cells, structures, layers, and/or grid arrays to improve component density without departing from the scope of the present teachings.

Figures 3A, 3B:
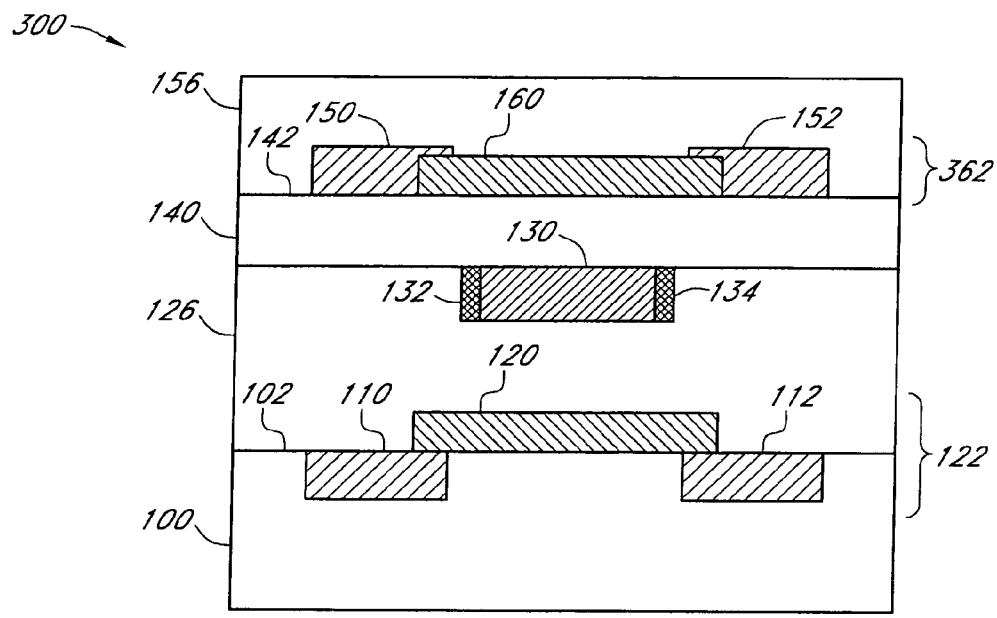
FIG. 3A illustrates still another embodiment of a magnetic memory device that may comprise a plurality of magnetic memory layers having at least one word line.
FIG. 3B illustrates still another embodiment of a plurality of magnetic memory layers that may be stacked in a layered configuration so as to form a still another multiple layer grid array.

FIG. 3A illustrates still another embodiment of a magnetic memory device 300 that may comprise a plurality of magnetic memory layers 122, 362 having at least one word line 130. In one aspect, the third magnetic memory device 300 may comprise the same scope and functionality of the first magnetic memory device 180 as illustrated in FIGS. 1A–1L with the formation of first and fourth electrodes above the upper surface 142 of the second insulating layer 140. It should be appreciated that the electrodes 150, 152 may be formed using a generally known pattern and etch metallization technique, such as chemical vapor deposition (CVD). In addition, the electrodes 150, 152 may be positionally oriented in a manner so as to electrically interconnect with the second magnetic memory structure 160 and form a fourth magnetic memory layer 362.

FIG. 3B illustrates yet another embodiment of a magnetic memory device 320 that may comprise a plurality of magnetic memory layers 122, 362, 392 having at least one word line 130. As illustrated in FIG. 3B, the magnetic memory device 320 may comprise the same scope and functionality of the magnetic memory device 300 as illustrated in FIG. 3A with the addition of another (fifth) magnetic memory layer 392. It should be appreciated that additional magnetic memory layers may be formed above or below the first and fourth magnetic memory layers 122, 162 in a manner as previously described by one skilled in the art without departing from the scope of the present teachings. In addition, it should also be appreciated that the order in which the magnetic memory layers 122, 362, 392, including the at least one word line 130, are positionally oriented and/or configured may be changed and/or altered by one skilled in the art without departing from the scope of the present teachings.

In one embodiment, a fifth magnetic memory structure 390 and a plurality of electrodes 380, 382 may be formed on the upper surface of the third insulating layer 156 in a manner as previously described with reference to the fourth magnetic memory layer 362 in FIG. 3A. In addition, after forming the fifth magnetic memory layer 392, a sixth insulating layer 386 may be formed on the upper surface of the third insulating layer 156 in a manner so as to overlie the third insulating layer 156 and the fifth magnetic memory layer 392.

Although the following description exemplifies one embodiment of the present teachings, it should be understood that various omissions, substitutions, and changes in the form of the detail of the apparatus, system, and/or method as illustrated as well as the uses thereof, may be made by those skilled in the art, without departing from the scope of the present teachings. Consequently, the scope of the present teachings should not be limited to the disclosed embodiments, but should be defined by the appended claims.

What is claimed is:

1. A method of forming a magnetic memory device on a substrate, the method comprising:
    forming a first and second electrode on the substrate;
    forming a first magnetic memory component on the first and second electrode in a manner so as to be electrically coupled therewith;
    forming a first insulation layer on the substrate in a manner so as to overlie the first magnetic memory component and the first and second electrode;
    forming a word line on the first insulation layer;
    forming a second insulating layer on the first insulating layer in a manner so as to overlie the word line;
    forming a third and fourth electrode on the second insulating layer;
    forming a second magnetic memory component on the third and fourth electrode in a manner so as to be electrically coupled therewith, and wherein forming the second magnetic component increases the storage and fabrication density of the memory device; and
    forming a third insulating layer on the second insulating layer in a manner so as to overlie the second magnetic memory component and the third and fourth electrodes.

2. The method of claim 1, wherein forming the first and second electrode on the substrate includes forming the first and second electrode using a dual damascene process.

3. The method of claim 1, wherein forming the first and second magnetic memory component includes forming a first and second programmable component selected from the group consisting of a pseudo spin valve (PSV) device, magnetic tunneling junction (MTJ) device, an inline giant magneto-resistive (GMR) device, and a magneto-resistive random access memory (MRAM) device.

4. The method of claim 1, wherein forming the word line includes positioning the word line substantially perpendicular to the first and second electrodes.

5. The method of claim 1, wherein forming the third and fourth electrodes includes positioning the third and fourth electrodes substantially parallel to the first and second electrodes and substantially perpendicular to the word line.

6. The method of claim 1, wherein the method further comprises forming at least one magnetic keeper adjacent to the word line.

7. A method of increasing the density of a magnetic memory device having a substrate, the method comprising:
   forming a first memory layer on the substrate, wherein the first memory component comprises at least one magnetic storage component and a plurality of electrodes electrically coupled therewith;
   forming a word line on the first memory layer; and
   forming second memory layer above the word line, wherein the second memory layer comprises at least one magnetic storage component and a plurality of electrodes electrically coupled therewith, and wherein forming the second memory layer increases the fabrication density of the magnetic memory device.

8. The method of claim 7, wherein forming the first memory layer includes planarizing the first memory layer.

9. The method of claim 7, wherein the method further comprises forming a first insulation layer between the first memory layer and the word line.

10. The method of claim 7, wherein forming the word line includes planarizing the word line.

11. The method of claim 7, wherein the method further comprises forming a second insulation layer between the word line and the second memory layer.

12. The method of claim 7, wherein forming the second memory layer includes planarizing the second memory layer.

13. The method of claim 7, wherein the method further comprises forming one or more additional memory layers on the second memory layer, wherein the one or more additional memory layers comprise at least one magnetic storage component and a plurality of electrodes electrically coupled therewith.

14. The method of claim 13, wherein the method further comprises forming one or more insulation layers between the additional memory layers.

* * * * *